United States Patent
Liu et al.

(10) Patent No.: US 11,239,961 B2
(45) Date of Patent: *Feb. 1, 2022

(54) RECEIVER CIRCUIT AND METHODS

(71) Applicant: Telefonaktiebolaget LM Ericsson, Stockholm (SE)

(72) Inventors: Yuhang Liu, Lund (SE); Joakim Axmon, Limhamn (SE); Michael Breschel, Lund (SE); Johan Hill, Lund (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

This patent is subject to a terminal disclaimer.

(21) Appl. No.: 17/014,214

(22) Filed: Sep. 8, 2020

(65) Prior Publication Data
US 2020/0403742 A1  Dec. 24, 2020

Related U.S. Application Data

(63) Continuation of application No. 16/077,960, filed as application No. PCT/EP2017/053234 on Feb. 14, 2017, now Pat. No. 10,797,835.

(Continued)

(51) Int. Cl.
*H04L 5/00* (2006.01)
*H03M 1/12* (2006.01)
(Continued)

(52) U.S. Cl.
CPC ........ *H04L 5/0007* (2013.01); *H03M 1/1255* (2013.01); *H03M 1/46* (2013.01); *H04B 1/16* (2013.01); *H04L 27/2647* (2013.01)

(58) Field of Classification Search
CPC .............. H04L 5/0007; H04L 27/2647; H04L 27/2689; H03M 1/1255; H03M 1/46;
(Continued)

(56) References Cited

U.S. PATENT DOCUMENTS 7,573,944 B2   8/2009   Chang et al.
8,487,795 B1   7/2013   Jiang et al.
(Continued)

FOREIGN PATENT DOCUMENTS

CN   101039292 A   9/2007
CN   103095638 A   5/2013
(Continued)

OTHER PUBLICATIONS

Intel Corporation, On device complexity for NB-IoT, Nov. 16-20, 2015 (Year: 2015).*

(Continued)

*Primary Examiner* — Kenneth T Lam
(74) *Attorney, Agent, or Firm* — Murphy, Bilak & Homiller, PLLC

(57) ABSTRACT

Disclosed is a receiver circuit comprising an analog-to-digital converter (ADC) circuit having an analog input, a clock input, and a digital output, and a clock divider circuit having a reference clock input and a phase selector input, and having a clock output coupled to the clock input of the ADC circuit. The clock divider circuit is configured to divide a reference clock signal coupled to the reference clock input at a reference clock frequency, to produce a clock output signal at an ADC clock frequency, at the clock output, such that the reference clock frequency is an integer multiple N of the ADC clock frequency. The clock divider circuit is further configured to select from among a plurality of selectable phases of the clock output signal, responsive to a phase selector signal applied to the phase selector input.

17 Claims, 15 Drawing Sheets

Related U.S. Application Data

(60) Provisional application No. 62/295,327, filed on Feb. 15, 2016.

(51) Int. Cl.
*H03M 1/46* (2006.01)
*H04B 1/16* (2006.01)
*H04L 27/26* (2006.01)

(58) Field of Classification Search
CPC ......... H03M 1/0624; H04B 1/16; H04B 1/40; H03L 7/0996
See application file for complete search history.

(56) References Cited

U.S. PATENT DOCUMENTS

| | | | |
|---|---|---|---|
| 8,964,881 B2 | 2/2015 | Goswami | |
| 9,998,313 B2 | 6/2018 | Hill et al. | |
| 10,425,263 B2* | 9/2019 | Hill | H04L 5/0037 |
| 10,785,076 B2* | 9/2020 | Hill | H04L 27/2607 |
| 10,797,835 B2* | 10/2020 | Liu | H03M 1/0624 |
| 2004/0184551 A1 | 9/2004 | Liu et al. | |
| 2005/0084025 A1 | 4/2005 | Chen | |
| 2007/0064839 A1 | 3/2007 | Luu et al. | |
| 2007/0274416 A1 | 11/2007 | Ishii | |
| 2008/0123592 A1 | 5/2008 | Popovic | |
| 2008/0292027 A1 | 11/2008 | Liu et al. | |
| 2010/0260276 A1 | 10/2010 | Orlik et al. | |
| 2014/0256277 A1 | 9/2014 | Ki et al. | |
| 2015/0139190 A1 | 5/2015 | Patel et al. | |
| 2015/0181575 A1 | 6/2015 | Ng et al. | |
| 2016/0149743 A1 | 5/2016 | Rong et al. | |
| 2017/0033887 A1 | 2/2017 | Lei et al. | |
| 2017/0093606 A1 | 3/2017 | Dutronc et al. | |
| 2017/0238344 A1 | 8/2017 | Mcgowan et al. | |
| 2017/0303163 A1* | 10/2017 | Sharma | H04W 28/04 |
| 2018/0123845 A1 | 5/2018 | Hill et al. | |
| 2019/0013913 A1 | 1/2019 | Suzuki et al. | |
| 2019/0260625 A1 | 8/2019 | Axmon et al. | |
| 2019/0349231 A1 | 11/2019 | Hill et al. | |

FOREIGN PATENT DOCUMENTS

| | | |
|---|---|---|
| CN | 103986686 A | 8/2014 |
| RU | 2369030 C2 | 9/2009 |
| WO | 9703509 A1 | 1/1997 |
| WO | 2017013533 A1 | 1/2017 |
| WO | 2017018966 A1 | 2/2017 |
| WO | 2017108111 A1 | 6/2017 |

OTHER PUBLICATIONS

Huang, Hao, "A 6-GS/s 6-bit Time Interleaved SAR-ADC", Proceedings of the 8th European Microwave Integrated Circuits Conference, Nuremberg, Germany, Oct. 6-8, 2013, 37-40.

Unknown, Author, "Analysis of UE RF transceiver architecture for NB-IoT", 3GPP TSG.RAN WG4 Meeting #77 NB-IOT AH, R4-77AH-IoT-0002, Budapest, Hungary, Jan. 20-22, 2016, 1-4.

Unknown, Author, "Analysis of Uplink Transmit Timing in NB-IoT", Ericsson, 3GPP TSG RAN WG4 Meeting #78bis, R4-161945, San Jose del Caba, Mexico, Apr. 11-15, 2016, 1-7.

Unknown, Author, "Discussion on downlink NB-IOT solutions", 3GPP TSG RAN WG1 Meeting #82bis, R1-155896, Malmo, Sweden, Oct. 5-9, 2015, 1-4.

Unknown, Author, "In-band operation for NB-IOT", 3GPP TSG-RAN WG1 Meeting #82bis, R1-155980, Malmö, Sweden, Oct. 5-9, 2015, 1-4.

Unknown, Author, "Narrow band OFDMA based proposal for GERAN Cellular IoT", 3GPP TSG GERAN #64, Tdoc GP-140839, San Francisco, USA, Qualcomm Incorporated, Nov. 17-21, 2014, 1-17.

Unknown, Author, "NB M2M—Overview of the Physical Layer Design", 3GPP TSG GERAN #63, GP-140563, Ljubljana, Slovenia, Huawei Technologies Co., Ltd., HiSilicon Technologies Co., Ltd., Aug. 25-29, 2014, 1-12.

Unknown, Author, "NB-CIoT—Introduction", 3GPP GERAN Adhoc#3 on FS_IoT_LC, GPC-150389, Neul Ltd, u-blox AG, Huawei Technologies Co., Ltd., HiSilicon Technologies Co., Ltd, Qualcomm Incorporated, Jun. 29-Jul. 2, 2015, 1-5.

Unknown, Author, "NB-IoT—downlink physical layer concept description", 3GPP TSG RAN WG1 Meeting #83, R1-156462, Anaheim, USA, Nov. 15-22, 2015, 1-11.

Unknown, Author, "NB-IoT—Synchronization Channel Evaluations", Ericsson, 3GPP TSG-RAN WG1 NB-IoT AdHoc, R1-160080, Budapest, Hungary, Jan. 18-22, 2016, 1-6.

Unknown, Author, "On device complexity for NB-IoT", Intel Corporation, 3GPP TSG RAN WG1 Meeting #83, R1-156524, Anaheim, USA, Nov. 16-20, 2015, 1-10.

Unknown, Author, "On DL Tone Spacing for Standalone Operation", Qualcomm Incorporated, 3GPP TSG RAN WGl #83, R1-157065, Anaheim, USA, Nov. 15-22, 2015, 1-7.

* cited by examiner

RECEIVER CIRCUIT AND METHODS

TECHNICAL FIELD

The present invention relates to receiver circuits generally, and more particularly relates to analog-to-digital converter circuits and corresponding methods.

BACKGROUND

The so-called Internet-of-Things (IoT) reflects a vision of virtually all objects being connected to the internet, where the objects can be anything from simple sensors to sophisticated machinery, such as vehicles. To support this vision, the Third-Generation Partnership Project (3GPP) is currently specifying a new kind of radio access technology (RAT), with strong commonalities with Long Term Evolution (LTE), but operating over a narrower bandwidth. This new RAT is referred to as Narrow-Band IoT (NB-IoT). Specification work is currently ongoing, and several decisions regarding deployment scenarios and duplex modes, downlink channels and signals, uplink channels and signals, and channel raster, have been made at 3GPP meetings.

Regarding deployment scenarios and duplex modes, three deployment scenarios have specified: standalone deployment; deployment in guard band between conventional LTE cells; and deployment within the band of conventional LTE cells.

Both Frequency-Division Duplex (FDD) and Time-Division Duplex (TDD) modes are in the scope of the 3GPP standardization efforts, but are to be covered in different releases. More particularly, support of an FDD mode is in Release 13 of the 3GPP standards, but the solution should be forward compatible with TDD, which is to be introduced in a later release.

Regarding downlink channels and signals, the downlink subcarrier spacing is proposed to be 15 kHz and the NB-IoT downlink system bandwidth is proposed to be 200 kHz, with an effective bandwidth of 180 kHz, i.e., 12 subcarriers with a subcarrier spacing of 15 kHz. This is the equivalent to a single physical resource block in a conventional LTE cell. Two configurations for cyclic prefix (CP) are considered: normal and extended, with the latter provided to facilitate the deployment of larger cells. FIG. 1 shows an exemplary downlink resource grid (in a time-frequency representation) for a normal cyclic prefix (NCP) and for an extended cyclic prefix (ECP), where the shaded areas indicate where NB-IoT-specific synchronization signals may be scheduled.

The number of transmission ports used by the network node for NB-IoT transmissions is assumed at this point to be one or two, where, for the latter, Space-Frequency Block Coding (SFBC) is assumed. The NB-IoT-specific channels that have been specified to some extent so far are the broadcast channel (NB-PBCH), the downlink control channel (NB-PDCCH), and the downlink shared channel (NB-PDSCH). It should be noted that the nomenclature is not finalized—the indicated names are used here to distinguish the channels from their counterparts in regular LTE cells. System information for NB-IoT is provided via a master information block that is transmitted on the NB-PBCH and for which format and allocation is known in advance, and via system information block(s) that are transmitted on NB-PDSCH.

In addition, new synchronization signals, e.g., NB Primary Synchronization Signal (NB-PSS) and NB Secondary Synchronization Signal (NB-SSS), are introduced, with, e.g., a single instance of NB-PSS and 504 instances of NB-SSS. The synchronization signals occupy a fixed number of Orthogonal Frequency Division Multiplexing (OFDM) symbols in each subframe that is carrying synchronization signals. The synchronization signals do not occupy the first three OFDM symbols in the subframe, and for the scenario where NB-IoT is deployed in the bandwidth of a regular LTE cell, Cell-specific Reference Signals (CRSs) of that regular LTE cell will puncture the NB-PSS or NB-SSS as necessary. For the normal cyclic prefix case, it is assumed that the NB-PSS and NB-SSS span nine or eleven OFDM symbols (to be down-selected to one value), and that six to eleven OFDM symbols within that span carry the synchronization information (to be down-selected to one value). For the extended cyclic prefix case, the corresponding figures are nine OFDM symbols and six to nine OFDM symbols, respectively. For the in-band scenario, NB-PSS and NB-SSS are boosted by 6 dB relative to the cell-specific reference signal (CRS) power level in the regular LTE cell. Also, the repetition rates of NB-PSS and NB-SSS might differ. For example, repetition intervals of 20 milliseconds and 80 intervals, respectively, have been proposed.

Regarding uplink channels and signals for NB-IoT, two solutions are proposed for uplink transmissions: single-tone transmissions using either of two configurations, e.g., 3.75 kHz and 15 kHz bandwidth, and multi-tone transmission using 15 kHz subcarrier spacing in a Single-Carrier Frequency-Division Multiple-Access (SC-FDMA) scheme. Details regarding uplink signals are still under investigation.

Regarding channel raster, the channel raster is assumed to be 100 kHz, although a sparser channel raster cannot be precluded, as it is still under discussion in the standardization body.

While existing LTE solutions for transmitters and receivers can be adapted to support NB-IoT, this approach may be unsuitable to support the deployment of millions of very low-cost devices for IoT operation. As detailed below, existing LTE solutions either operate at a sampling rate that may undesirably increase the financial and/or power costs of the corresponding devices, or operate at a cost-efficient sampling rate that undesirably degrades performance. Reducing that sampling rate, however, may negatively impact uplink transmission timing. Therefore, it is recognized herein that there remains a need for improved processing and timing solutions, particularly for NB-IoT devices.

SUMMARY

Embodiments of the techniques and apparatuses disclosed herein include a receiver circuit comprising an analog-to-digital converter (ADC) circuit having an analog input, a clock input, and a digital output, and a clock divider circuit having a reference clock input and a phase selector input, and having a clock output coupled to the clock input of the ADC circuit. The clock divider circuit is configured to divide a reference clock signal coupled to the reference clock input at a reference clock frequency, to produce a clock output signal at an ADC clock frequency, at the clock output, such that the reference clock frequency is an integer multiple N of the ADC clock frequency. The clock divider circuit is further configured to select from among a plurality of selectable phases of the clock output signal, responsive to a phase selector signal applied to the phase selector input. In some embodiments, the clock divider circuit is configured to select from among N selectable phases of the clock output signal.

Other embodiments of the presently disclosed techniques include a corresponding method of digitizing an analog signal. This method includes providing a reference clock signal having a reference clock frequency, and dividing the reference clock signal by an integer N, thereby producing a clock output signal at a clock frequency, wherein said producing the clock output signal comprises selecting one of a plurality of selectable phases of the clock output signal, responsive to a phase selector signal. The method further comprises applying the clock output signal to a clock input of an ADC circuit having an analog input and a digital output, and converting an analog signal provided to the analog input of the ADC circuit to a digital output signal, at the digital output of the ADC circuit.

Other embodiments disclosed herein include processing, in a receiver circuit, a signal comprising a first sequence of an integer number $N_{sym}$ of orthogonal frequency-division multiplexing (OFDM) symbols, which are transmitted within a frequency sub band of a second sequence of $N_{sym}$ OFDM symbols, where the first sequence of OFDM symbols and the second sequence of OFDM symbols are transmitted with the same timing, a first cyclic prefix of the second sequence of OFDM symbols has a first duration, a second cyclic prefix of the second sequence of OFDM symbols has a second duration, and the second duration is shorter than the first duration, such that in order to sample both the first and the second cyclic prefix with an integer number of equidistant samples, a first sampling rate is required. The method comprises sampling the signal comprising the first sequence of OFDM symbols at a second sampling rate, lower than the first sampling rate. The method further comprises adjusting a sampling phase during cyclic prefixes.

Some embodiments described herein may be understood as relating to a method of sampling an analog signal comprising a sequence of OFDM symbols, each OFDM symbol having a preceding cyclic prefix. This method comprises sampling the analog signal using a sampling clock signal having a first frequency, wherein the first frequency is such that each of at least first ones of the cyclic prefixes has a length that is not equal to an integer number of periods of the sampling clock signal. The method further comprises adjusting a phase of the sampling clock, for each of the at least first ones of the cyclic prefixes, so that samples for each OFDM symbol obtained by said sampling have the same timing, relative to the end of the corresponding symbol, as samples for the other OFDM symbols.

DETAILED DESCRIPTION

In this document, terminology from the 3GPP specifications for Long-Term Evolution (LTE) systems is used to describe the presently disclosed inventive techniques and apparatus. It will be appreciated, however, that embodiments of these inventive techniques and apparatus are not limited to implementations that use this terminology. Thus, for example, while the terms "user equipment" and "UE" are used herein to refer to access terminals, it will be appreciated that the techniques described herein are applicable to wireless terminals more generally and, indeed, may be applicable to wireless transceivers even more generally.

An analog-to-digital converter (ADC) converts an analog signal in continuous time into a digital one, in discrete time. In a UE, one or more ADCs form part of the RF circuitry, more precisely in the receiver. Several types of ADCs exist, each type having a different range of performances and complexities. Examples of ADC types include the delta-sigma converter, sometimes referred to as a sigma-delta converter, and the successive approximation register (SAR) converter. Conventionally, delta-sigma ADCs have been used in the radio receiver designs for UEs, something that has been called for by that in LTE systems, the sample rate per carrier may need to be up to 30.72 MS/s per carrier per in-phase and quadrature component. The reason for this is that a UE has to support the full range of LTE system bandwidths, from 1.4 MHz up to 20 MHz.

Figure 14:
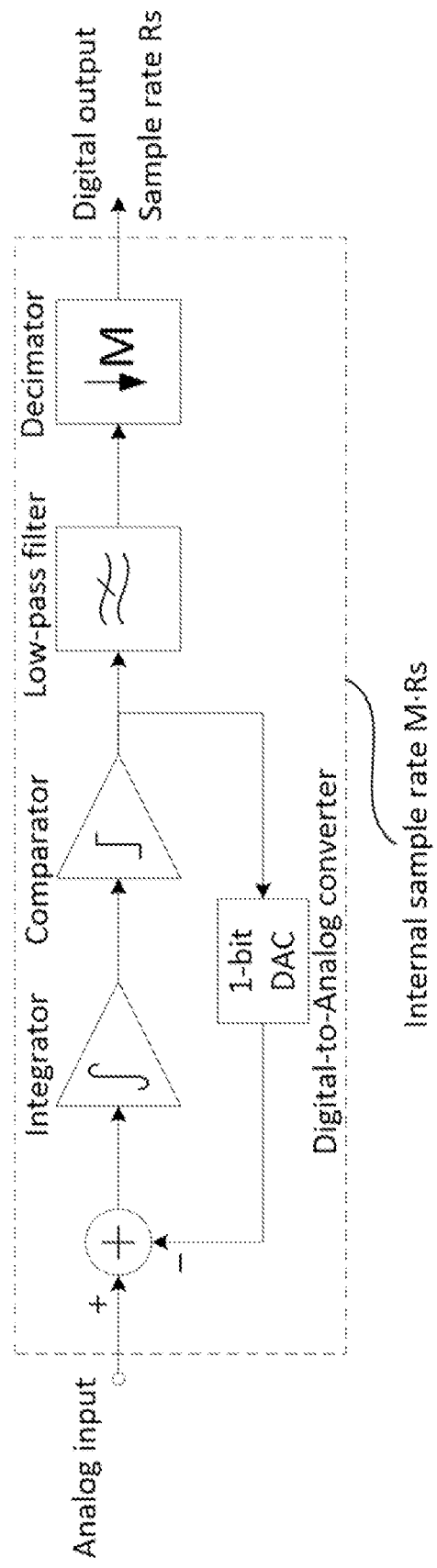
FIG. 14 illustrates an example $1^{st}$-order delta-sigma ADC.

FIG. 14 illustrates an example $1^{st}$-order delta-sigma ADC circuit, for reference. In the delta-sigma ADC, the analog signal is oversampled, i.e., at a higher rate than the rate at which samples are output, and it therefore includes decimation and digital low-pass filtering stages.

Figure 15:
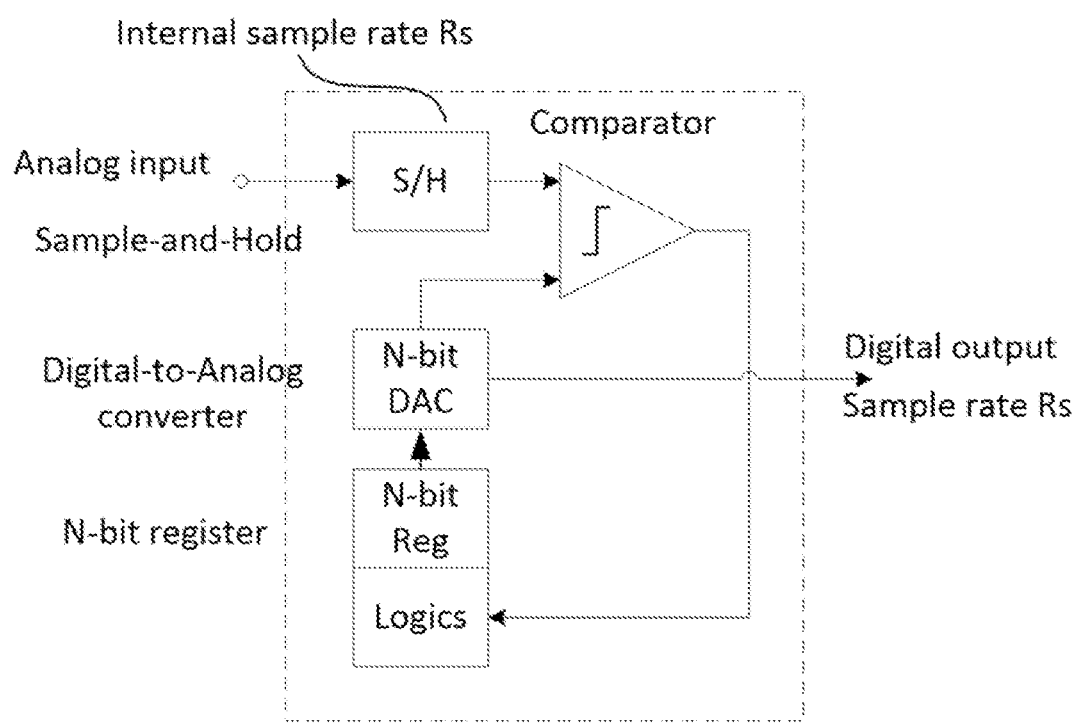
FIG. 15 illustrates an example SAR ADC.

A successive approximation register (SAR) ADC, on the other hand, samples the analog signal at the same sample rate as the rate at which samples are output from the device, and therefore no trailing decimation or digital low-pass filtering is needed. FIG. 15 illustrates an example SAR ADC.

Table 1 illustrates the recommendations from a leading components vendor for ADC type selection, for various applications.

TABLE 1

| ADC Topology | F Conversion | Resolution | Comments |
|---|---|---|---|
| SAR | ≤4 Msps | ≤16-bit | Simple operation, low |
|  | ≤1.25 Msps | ≤18-bit | cost, low power. |
| Delta-Sigma | ≤4 ksps | ≤31-bit | Moderate cost. |
|  | ≤4 Msps | ≤24-bit |  |
|  | ≤10 Msps | ≤16-bit |  |
| Pipeline | ≤200 Msps | ≤16-bit | Fast, expensive, |
|  | ≤250 Msps | ≤14-bit | higher power |
|  | ≤550 Msps | ≤12-bit | requirements. |

In an NB-IoT device, as contrasted with a conventional LTE receiver, it is sufficient to support a system bandwidth of 200 kHz (with an effective bandwidth of 180 kHz). This means that a device that is implemented solely to support NB-IoT and/or other radio access techniques with relatively small system bandwidths does not need to use the relatively more complex (expensive) and power-consuming delta-sigma ADC. Instead, the device may be designed using, for example, a successive approximation ADC, which will suffice for sampling at a sample rate of 1.92 MS/s per in-phase and quadrature component. Note that the successive approximation ADC is often referred to as a SAR ADC—these terms are used interchangeably in this document.

To maximize the power savings available from using a SAR ADC for a NB-IoT receiver, it would be desirable to operate the ADC on the lowest possible sample rate, which is 240 kilosamples per second (kS/s) in the case of NB-IoT. Note that the effective bandwidth of NB LTE is 180 kHz, even when it is deployed within a wide LTE carrier. Therefore, the radio frequency (RF) component of a NB LTE receiver is only required to capture a radio signal sent on a 180 kHz channel. According to the Nyquist sampling theorem, to capture the signal without any information loss, it is sufficient to have a 180 kHz sampling rate in the baseband of the receiver. Since there are 12 subcarriers, each having 15 kHz bandwidth, an FFT/IFFT size of 16 is chosen, to facilitate Fast-Fourier Transform (FFT) processing while minimizing the computational complexity as much as possible. Consequently, the baseband sampling rate is 15 kHz*16=240 kHz at the output of the RF stage of the receiver.

Figure 1:
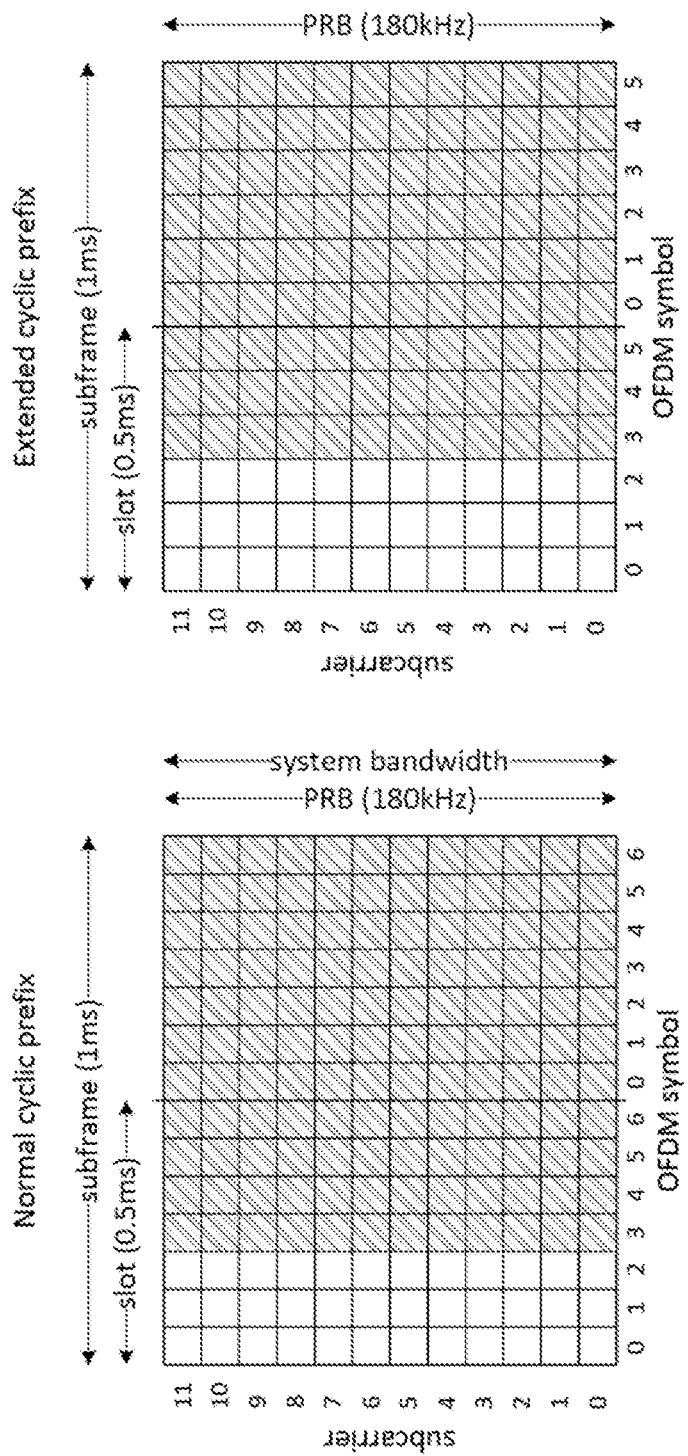
FIG. 1 shows exemplary downlink resource time-frequency grids for the normal cyclic prefix and extended cyclic prefix cases.
Figure 2:
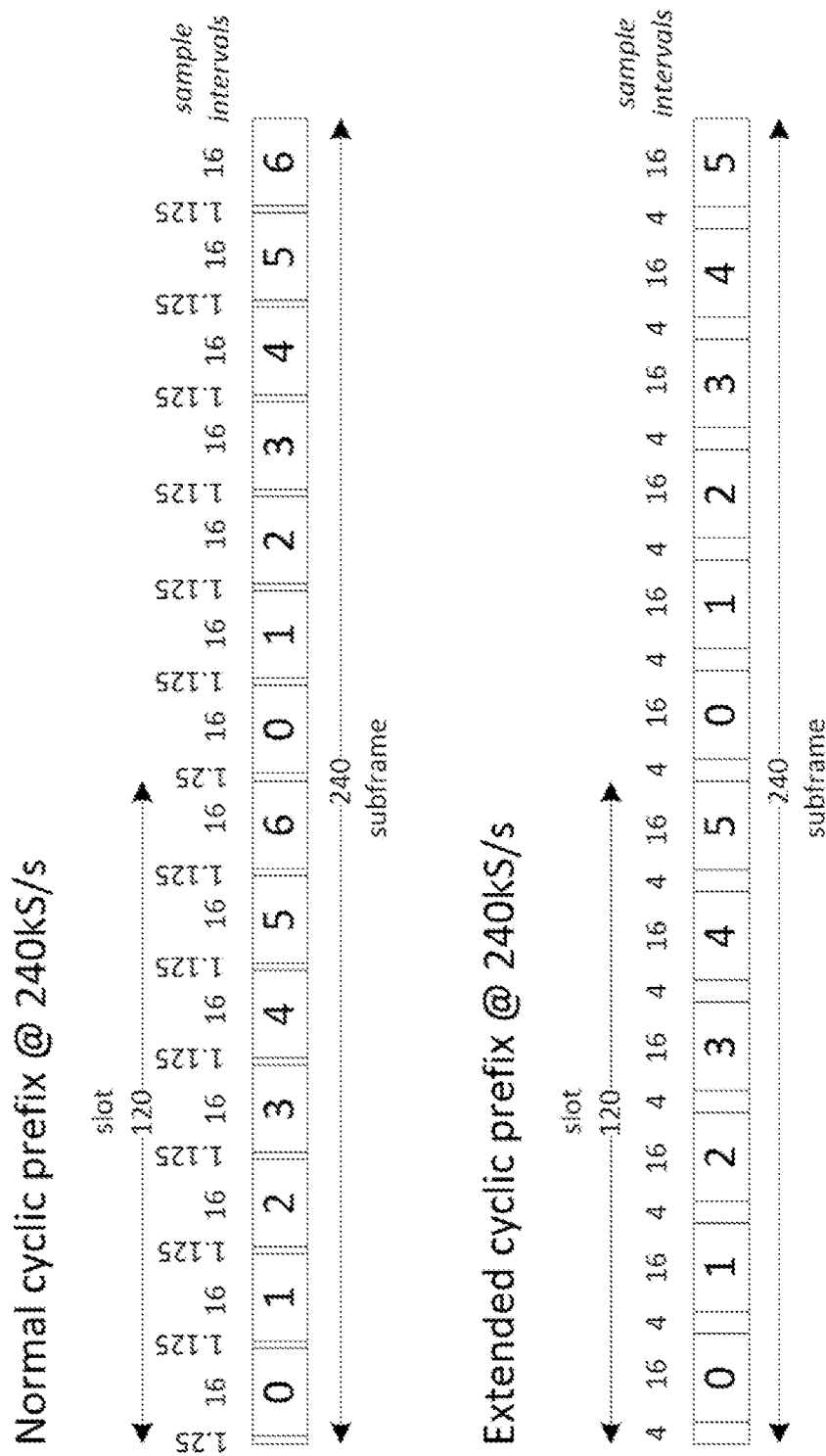
FIG. 2 illustrates the mapping of sample intervals for a 240-KHz sampling clock to OFDM symbols and cyclic prefixes, for the normal cyclic prefix case and the extended cyclic prefix case.

A complication is that at such a low sample rate, the cyclic prefix of the OFDM symbols has a length corresponding to a non-integer number of samples, for the normal cyclic prefix configuration. This is seen in FIG. 2, which illustrates the number of sample intervals for the cyclic prefixes and symbol times in each of the normal cyclic prefix and extended cyclic prefix cases, for a sample rate of 240 kS/s, for a single 1-millisecond subframe. As can be seen in the illustration, most of the cyclic prefixes in the normal cyclic prefix case have a length corresponding to 1.125 samples, with the first and eighth cyclic prefixes having a length corresponding to 1.25 samples.

When employing equidistant sampling, this means that unless care is taken with respect to when the first sample is collected, it may be the case that the sampled OFDM symbols in a slot gradually will have an increasing inter-symbol interference, due to the sample instance corresponding to the symbol start time gradually sliding outside the cyclic prefix. In other words, while FIG. 2 illustrates that using a 240-kHz sampling rate allows there to be a minimum of 16 samples for each symbol time, the fact that the cyclic prefixes in the normal cyclic prefix have lengths that do not correspond to integer multiples of the sampling time means that one of those 16 samples for a given OFDM symbol time might slide into the adjacent symbol time, if the sampling times are not very carefully aligned with respect to the subframe boundaries. This causes inter-symbol interference (ISI).

Thus, a problem with using a uniform sampling rate of 240 kS/s is that whenever the radio receiver is started (e.g., after a half-duplex transmission, after discontinuous receiver (DRX) inactivity, etc.), the sampling phase relative to the OFDM symbol timing, which determines how well the samples for a given OFDM symbol can stay within the cyclic prefix, has already been fixed, without being based on the serving cell timing.

One approach to solving this problem involves apparatuses and techniques by which the sample phase of the ADC (e.g., an SAR ADC) can be controlled from the baseband circuitry, to ensure that the sampling instances remain properly aligned to minimize ISI. Another approach involves the use of non-uniform sampling intervals. Example implementations for both of these approaches are disclosed below. As will be seen, both approaches facilitate the usage of low-cost low-power SAR ADCs in the NB-IoT radio receiver, and further facilitate operating such an NB-IoT device at a reduced sample rate that is lower than the sample rate at which any OFDM symbol inter-distance can be described as an integer number of samples. Thus the disclosed techniques and apparatuses allow cheaper devices to be produced, where such devices can operate on battery for longer times than would otherwise be possible. The disclosed techniques thus can be used to improve two of the key performance indicators for NB-IoT devices: cost and battery life.

Adjustable-Phase Sampling

Several embodiments of the presently disclosed techniques and apparatuses use a clock divider circuit that can be configured to clock the ADC, such as a SAR ADC, with any of N phases, where each phase corresponds to offsetting the sample timing by $1/N^{th}$ of the sample interval.

Figure 3:
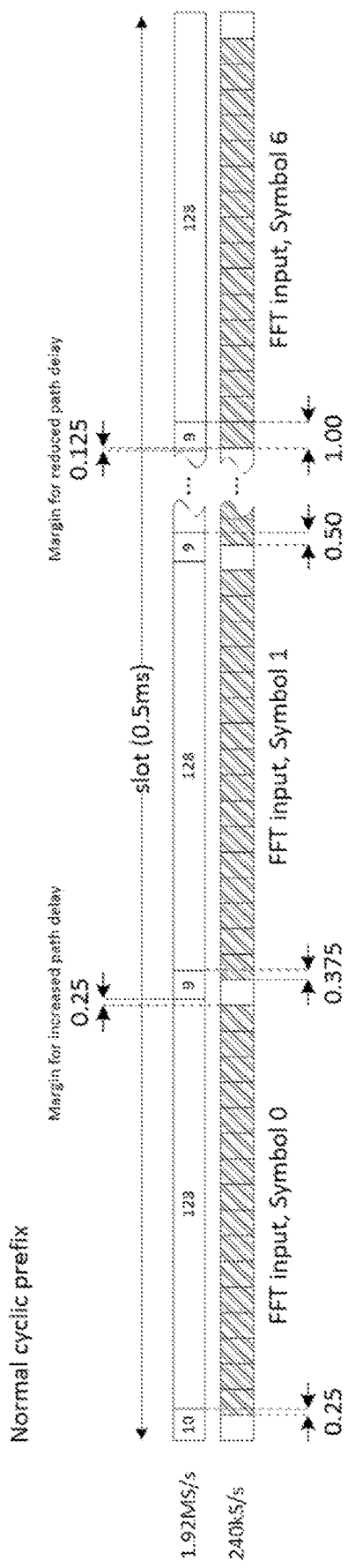
FIG. 3 illustrates symbol start offset jitter and margins for path delay, when a 240-kHz sampling clock is applied to an example NB-IoT signal.

As briefly discussed above, a problem when using a reduced sample rate (e.g. 240 kS/s) for NB-IoT is that the cyclic prefixes, in the normal cyclic prefix case, have lengths corresponding to a non-integer number of samples. This shifts the start positions relative to the sampling grid to different values, for different symbols in a slot. This is illustrated in FIG. 3, which illustrates the number of sample intervals for the cyclic prefixes and symbol times in the normal cyclic prefix case, for a sample rate of 240 kS/s, for a single 1-millisecond subframe. FIG. 3 also shows the jitter in the symbol start offset, due to this issue, as well as the margins for path delay change, as expressed in terms of the sample interval.

To prevent inter-symbol interference, the start of the sampling for a given OFDM symbol has to be taken within the cyclic prefix of that symbol. Provided that the start of a radio frame is perfectly aligned with the sample grid, the start positions for the FFT of each OFDM symbol are as shown in Table 2.

Figure 4:
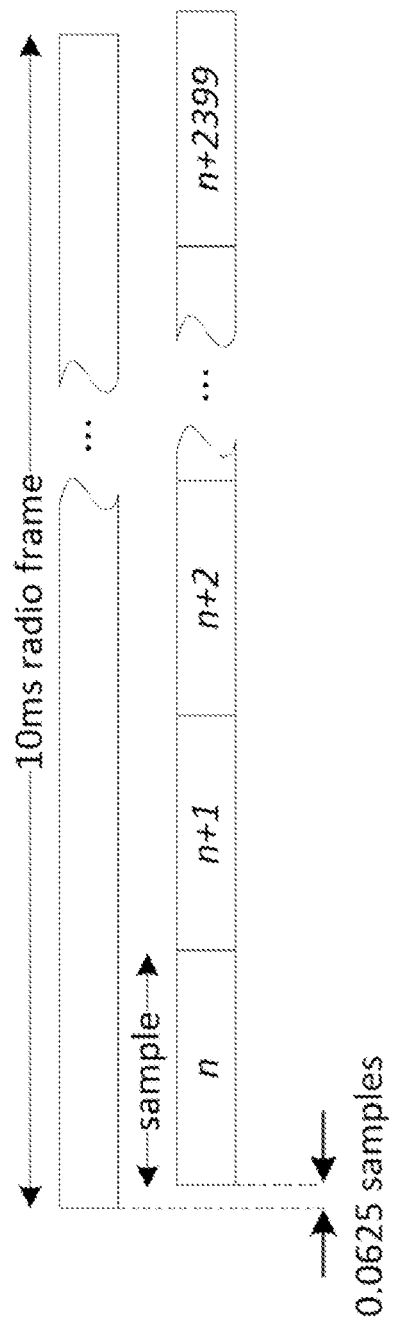
FIG. 4 illustrates the optimum timing relation between sample grid and radio frame start for a sample rate of 240 kS/s and a serving cell with normal cyclic prefix.

As illustrated in FIG. 3, which is based on a perfect alignment of sample phase and radio frame timing, there is a margin for a path delay increase (or cell timing misalignment) of up to 0.25 samples, without any OFDM symbol being sampled outside the cyclic prefix. At the same time, there is a margin for a reduced path delay (or cell timing misalignment) of up to only 0.125 samples. The margin for change in path delay can be adjusted by applying some offset in how the UE sampling intervals are aligned with the received radio frame. Particularly, by applying an offset of 0.0625 samples when deciding the optimum sample phase, one can get symmetrical sample offset margins of 0.1875 samples each. This can be seen in FIG. 4, which shows the optimum timing relation between sample grid and radio frame start, for a sample rate of 240 kS/s and a serving cell with normal cyclic prefix.

TABLE 2

| Symbol | | Normal cyclic prefix | | Extended cyclic prefix | |
|---|---|---|---|---|---|
| | | Symbol start [sample] | Offset [samples] | Symbol start [sample] | Offset [samples] |
| slot 0 | 0 | 1 | −0.25 | 2 | −2 |
| | 1 | 18 | −0.375 | 22 | −2 |
| | 2 | 35 | −0.5 | 42 | −2 |
| | 3 | 52 | −0.625 | 62 | −2 |
| | 4 | 69 | −0.75 | 82 | −2 |
| | 5 | 86 | −0.875 | 102 | −2 |
| | 6 | 103 | −1 | | |
| slot 1 | 0 | 121 | −0.25 | 122 | −2 |
| | 1 | 138 | −0.375 | 142 | −2 |
| | 2 | 155 | −0.5 | 162 | −2 |
| | 3 | 172 | −0.625 | 182 | −2 |
| | 4 | 189 | −0.75 | 202 | −2 |
| | 5 | 206 | −0.875 | 222 | −2 |
| | 6 | 223 | −1 | | |

A problem addressed here, then, is how to control a SAR ADC, which is operating at the reduced sample rate (e.g. 240 kS/s), in such a fashion that the sample timing can be controllably offset by less than a full sample, e.g., in steps of ⅛th of a sample when using the sample rate 240 kS/s, in order to achieve the desirable alignment between a sample interval and the radio frame start timing.

Figure 5:
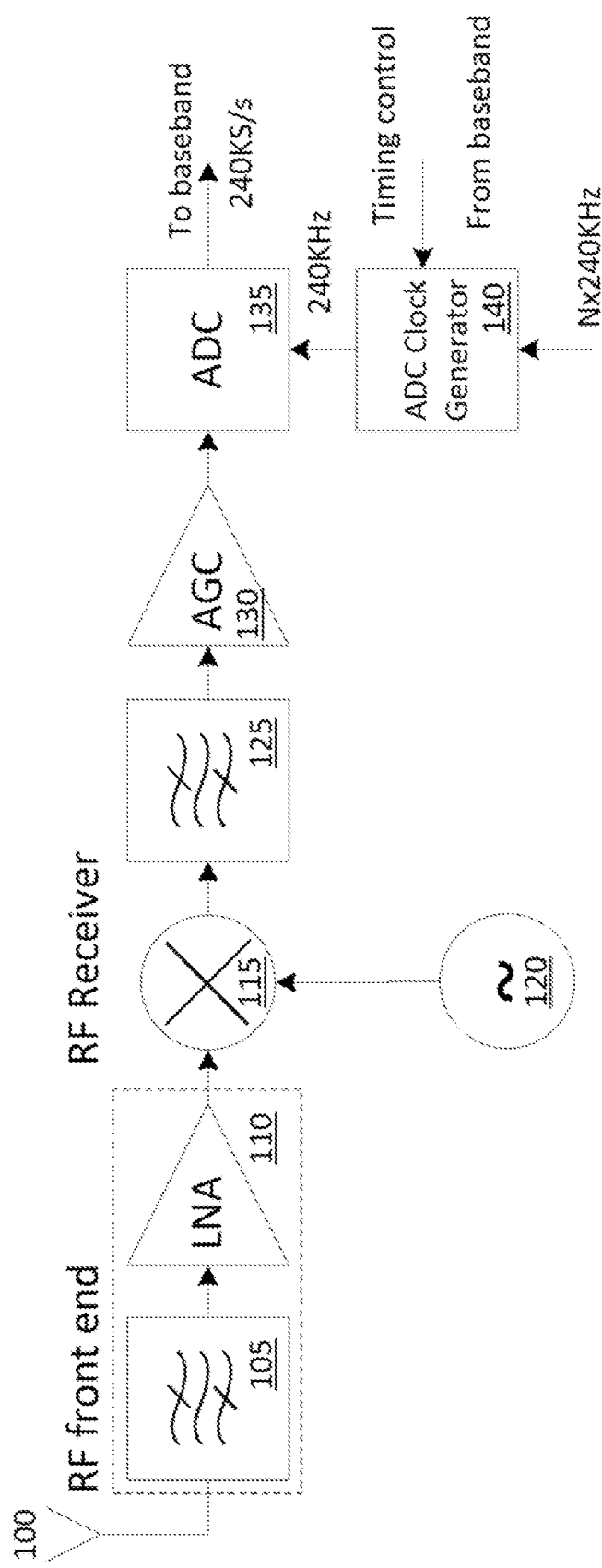
FIG. 5 illustrates an example receiver according to some embodiments of the presently disclosed techniques and apparatus.

FIG. 5 illustrates an example radio receiver in which the presently disclosed techniques and apparatus may be implemented. The illustrated radio receiver comprises a radio-frequency (RF) front-end circuit, which is connected to an antenna 100 and which includes a front-end RF filter 105 and a low-noise amplifier 110. This front-end circuit is followed by a mixer 115, which is driven by a local oscillator 120 to convert the received signal (in the NB-IoT case, a 200-KHz-wide RF signal) to an intermediate frequency or to baseband, for digitization. An IF filter 125 is coupled to the output of the mixer 115, and provides the filtered IF signal to an automatic-gain-control (AGC) amplifier 130. The output of the AGC amplifier 130 is provided to an ADC 135, which, in the illustrated example, is driven by a 240 kHz sampling clock and which supplies a 240-kS/s digital signal to a baseband processing circuit (not shown) for processing. Key aspects of the techniques according to this first approach will be found in the ADC clock generator circuit 140, which generates the 240-kHz sampling clock, at a selectable phase, from a reference clock at N times the 240-kHz sampling frequency.

According to the present techniques, then, the ADC 135 is clocked at a frequency of 240 kHz instead of at 1.92 MHz, a frequency that is commonly used in designs for LTE receivers. This lower sampling rate facilitates lower complexity, lower power consumption in the RF receiver, and a lower data rate in the baseband signal processing that immediately follows. An ADC clock generator circuit 140 is added to provide the ADC 135 with a 240-kHz clock signal that has a configurable phase shift, to achieve a desired sampling time accuracy. The timing control signal shown in FIG. 5, which is essentially a phase selection signal that selects one out of N selectable phases for the ADC clock generator circuit's output signal, comes from timing tracking functionality in the baseband processing circuitry.

The input reference clock into the ADC clock generator circuit 140 is N times faster than the 240-kHz sampling frequency, where N is dependent on the time resolution requirement of system. In the exemplary systems described herein, N is selected to be eight—this allows existing 1.92 MHz clock circuits to be used and also facilitates the use of a simple clock-divider design. However, other values for N may be used, depending on available reference clocks and the necessary resolution of the adjustable phase.

Figure 6:
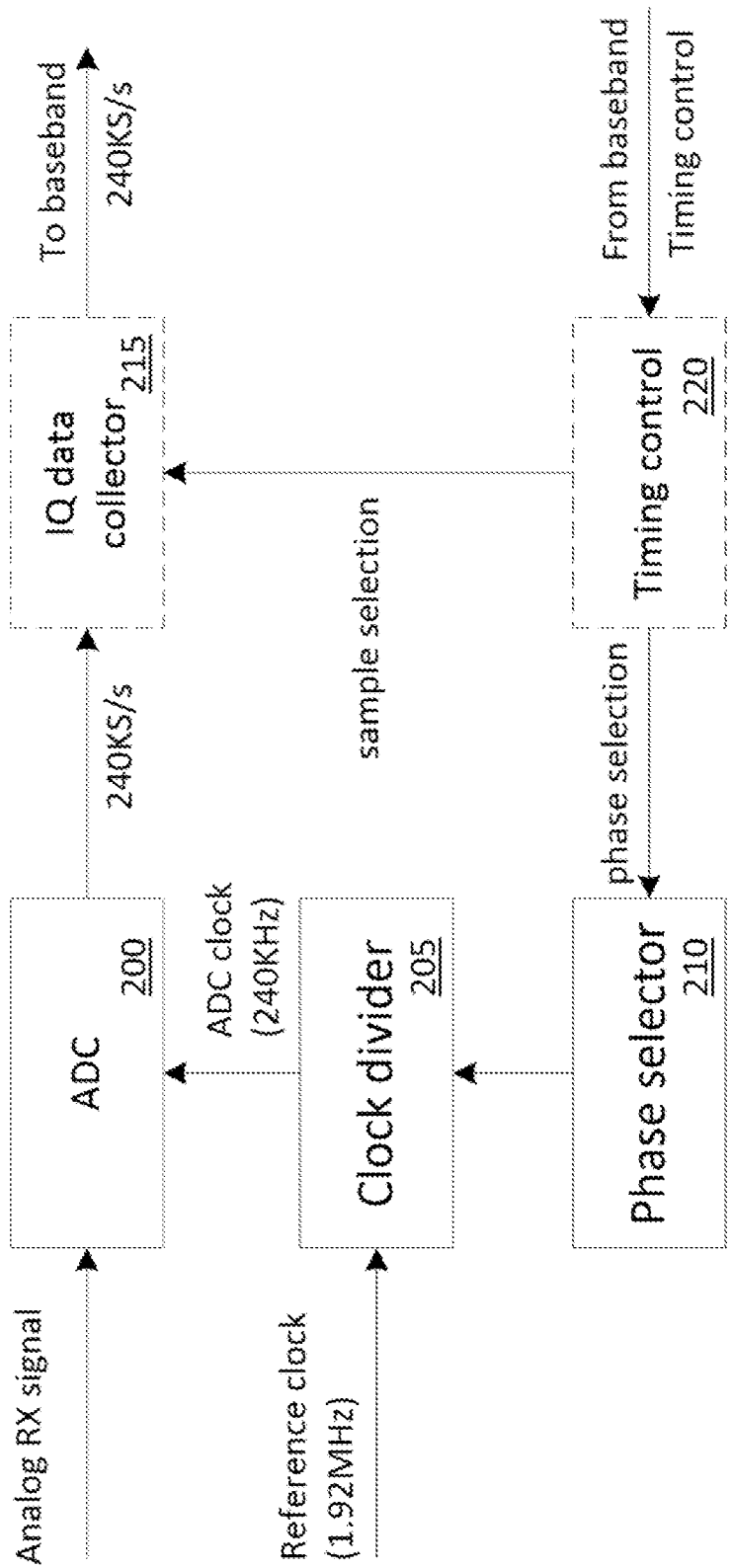
FIG. 6 illustrates an ADC clock generator circuit and its control, according to some embodiments of the presently disclosed techniques and apparatus.

FIG. 6 illustrates details of an example ADC clock generator circuit, here comprising clock divider 205 and phase selector 210, as coupled to an ADC 200. In FIG. 6, a timing control function 220 and an IQ data collector function 215 are also shown—these are, often, part of a baseband processing circuit that is separate from the ADC 200, as the former is generally a digital circuit while the latter is a mixed-signal circuit. It will be appreciated that the clock divider 205 and phase selector 210 can be implemented with very simple digital logic, and can be combined, in various embodiments, on a single chip or in a single module with the ADC 200, with the baseband processing circuit that includes the IQ data collector function 215 and timing control function 230, or even with the circuit that produces the reference clock input to the clock divider 205.

Figure 7:
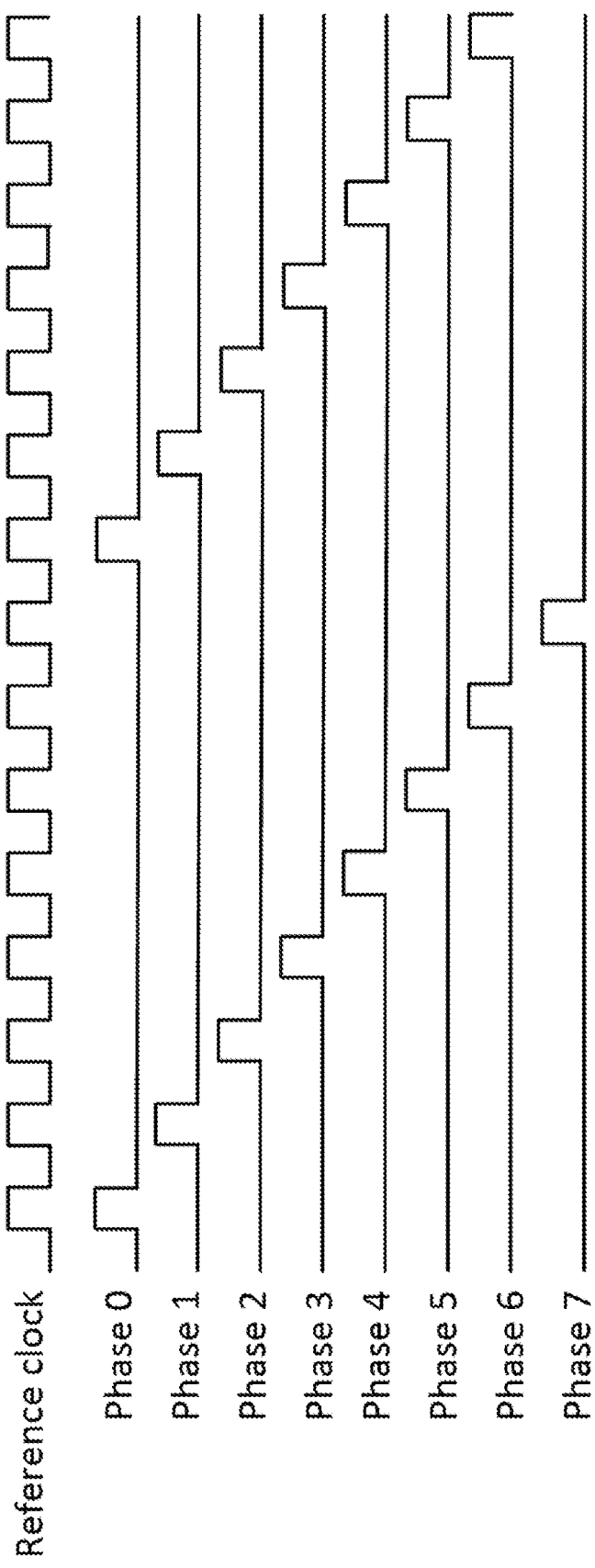
FIG. 7 illustrates reduced rate clock pulses generated based on a minimum rate clock.

Note that the example implementation shown in FIG. 6 assumes that a time resolution of (1/1.92) microseconds is required to achieve the desired system performance. That is, in this example, N equals eight. The clock divider 205 reduces the input frequency by factor of eight, thereby providing a 240-kHz clock to the ADC 200, with the phase (i.e., time offset) of the 240-kHz clock signal being determined by the output from the phase selector 210. FIG. 7 illustrates the clock decimation and the exemplary ADC clock with eight different phases. Those familiar with basic digital logic design will appreciate that a clock divider circuit as described herein can be easily implemented as a modulo counter, whereby the sampling phase can be shifted by changing the value that the modulo counter output shall fulfill for generating a reduced rate clock sample, thus generating an absolute change in sample phase. Thus, for example, a divide-by-eight circuit operating with an input frequency of 1.92 MHz can be readily designed with conventional digital circuit design techniques, with a simple example consisting of three cascaded flip-flops and configured as a counter, such that each flip-flop divides its inputs by two. A digital phase selector to choose from among multiple possible phases for the clock divider can also be readily designed, e.g., using selectable combinations of the counter's outputs to gate the clock divider's output signal. It will be appreciated that other clock divider circuits providing the same functionality are possible.

Baseband processing keeps track of downlink timing continuously. Once a receiver timing adjustment is needed, as determined by the baseband processing circuit from this time tracking, the baseband processing gives the timing adjustment to the RF receiver. This timing adjustment can include an integer and a fractional part of a sampling interval (based on 240 KS/s sampling rate), for example. In these embodiments, the fractional part is sent to the phase selector 210 to select the best phase, from among the multiple available phases, for the ADC clock. The integer part is given to the IQ data collector function 215, to determine a proper starting address in the IQ data buffer where the ADC writes the quantized sample value of the receiver (RX) signal. Note that the IQ data collector 215 and the timing control 220 may be part of the baseband processing circuit and/or the radio receiver circuitry, in various embodiments.

The IQ data collector 215 may further exist in multiple logical instances, where one such instance is serving one cell; a serving cell or a neighbor cell. Different logical instances of the IQ data collector 215 may reside in different places, in some embodiments—for example, the serving cell IQ data collector may reside in the radio receiver whereas the IQ data collectors for neighbor cells, being subjected to measurements, may reside in the baseband. The different instances of IQ data collectors may further have different roles, such as where the one for the serving cell dictates where to write samples from the radio receiver, while the ones for the neighbor cells tell where in the data buffer to find a sample for a certain time position with respect to each respective neighbor cell.

Given the detailed examples described above, it will be appreciated that embodiments of the presently disclosed apparatuses include receivers comprising an ADC, e.g., like ADC 200 in FIG. 6, having an analog input, a clock input, and a digital output. These embodiments further include a clock divider circuit, e.g., corresponding to clock divider 205 and phase selector 210, in FIG. 6, having a reference clock input and a phase selector input, and having a clock output coupled to the clock input of the ADC circuit. The clock divider circuit in these embodiments is configured to divide a reference clock signal coupled to the reference clock input at a reference clock frequency, to produce a clock output signal at an ADC clock frequency, at the clock output, such that the reference clock frequency is an integer multiple N of the ADC clock frequency. Further, the clock divider circuit is configured to select from among a plurality of selectable phases of the clock output signal, responsive to a phase selector signal applied to the phase selector input. In some embodiments, the clock divider circuit is configured to select from among N selectable phases of the clock output signal, responsive to the phase selector signal.

In some embodiments, the receiver circuit further comprises a clock circuit coupled to the reference clock input. This clock circuit may be configured to provide the reference clock signal at a frequency of 1.92 MHz, for example. In some of these embodiments, N is eight. In some embodiments, the ADC circuit is a successive approximation ADC circuit.

Figure 8:
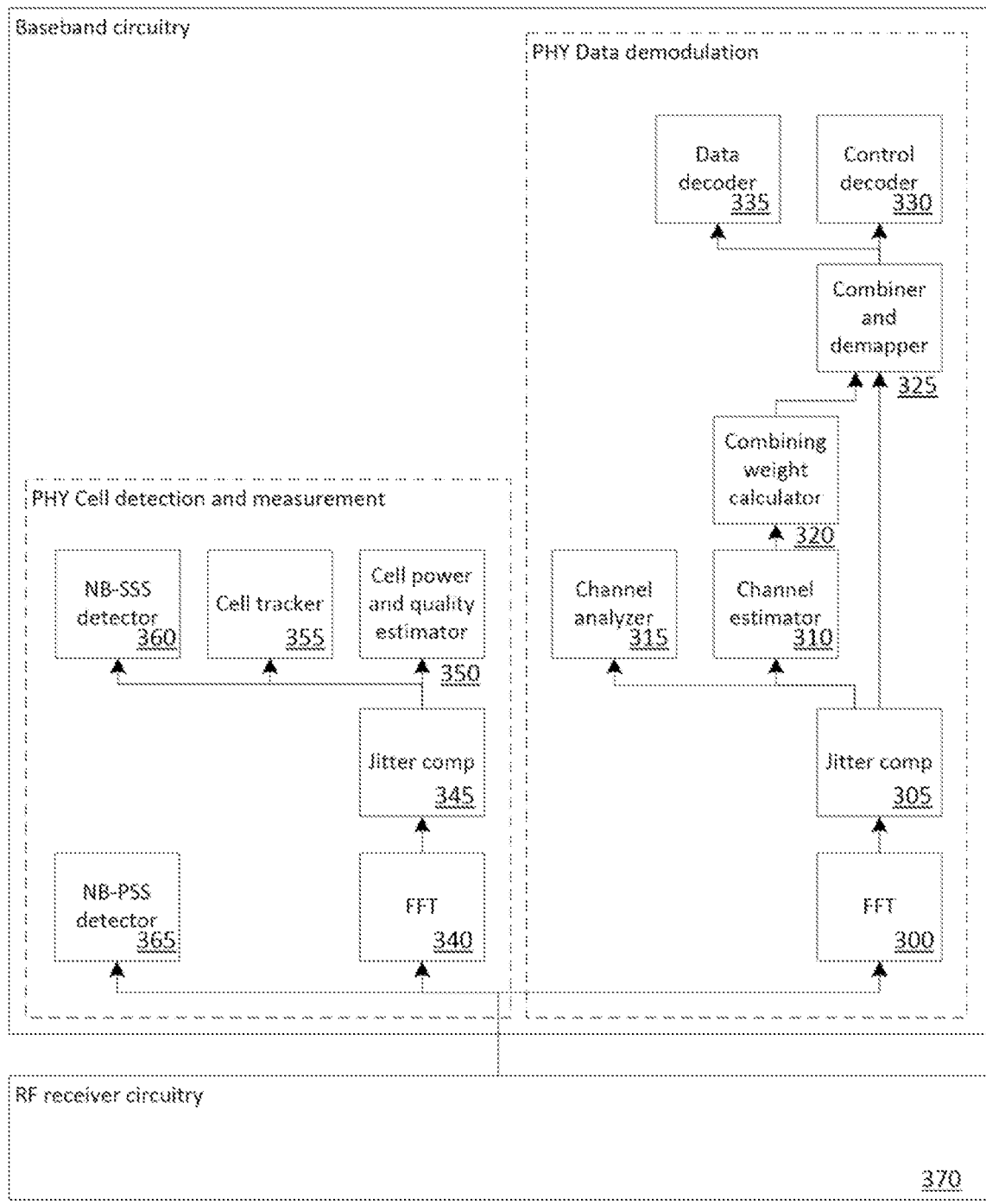
FIG. 8 illustrates details of an example baseband processing circuit.

In some embodiments, the receiver circuit further comprises a baseband processing circuit configured to receive a sampled signal from the digital output of the ADC circuit and further configured to demodulate an OFDM signal conveyed by the sampled signal. An example baseband processing circuit is shown in FIG. 8, which is described in detail below; it will be appreciated that the processing may be implemented using conventional techniques for processing OFDM signals, for example. Thus, in some embodiments, the baseband processing circuit is configured to demodulate OFDM signals consisting of 12 subcarriers at a subcarrier spacing of 15 kHz, and in some of these embodiments, the baseband processing circuit is configured to receive the sampled signal at a sample rate of 240 kHz. Likewise, in some of these embodiments, the baseband processing circuit is configured to selectively demodulate OFDM signals consisting of 14 OFDM symbols per 1-millisecond subframe. In some embodiments, this may correspond to a normal cyclic prefix mode, where the baseband processing circuit is further configured to selectively demodulate OFDM signals consisting of 12 OFDM symbols per 1-millisecond subframe, e.g., corresponding to an extended cyclic prefix mode.

An exemplary NB-IoT physical layer architecture for the relevant downlink parts is also shown in FIG. 8. RF circuitry 370 delivers samples to the baseband circuitry, e.g., at a sampling rate of 240 kS/s. The samples are used for data demodulation (common control, dedicated control, broadcasts, unicast and multicast data) by the PHY (physical layer) data demodulation unit. Each time-domain OFDM symbol that is to be demodulated is subjected to an FFT 300 (e.g., a 16-point FFT in the case of a 240-kS/s system) and the twelve outputs that correspond to the resource elements (REs) of the OFDM symbol are fed to a Jitter compensation unit 305, which compensates for the symbol start jitter. Thereafter the RE samples are fed to the channel estimator 310, channel analyzer 315, and the combiner and demapper 325. The channel estimator 310 estimates the propagation channel using prior known signals, such as pilots/reference symbols (which may be common or dedicated) or synchronization signals. In the event that two antenna ports are used by the network node, there are two radio paths to the single receiver antenna used by the example NB-IoT device. The combining weight calculator unit 320 takes the channel estimates and determines the optimum way of combining the data received over two radio paths. It provides combining weights to the combiner and demapper 325, which uses the weights when combining the data. The combiner and demapper 325 converts the combined modulation symbols carried by the REs into soft bits, which then are fed to the data decoder 335 or the control decoder 330 for decoding.

The same samples that are received from the RF circuitry may also be used for detection of new intra-frequency neighbor cells, and for tracking and measurements of detected neighbor cells. The primary synchronization signal detection is carried out in the time domain by an NB-PSS detector 365. Once an NB-PSS has been detected, the identity of the detected cell is determined by detecting the associated NB-SSS, which uniquely provides the physical layer identity of the cell. The NB-SSS is detected by NB-SSS detector 360. NB-SSS operates in the frequency domain and hence is carried by transformed 340 and jitter-compensated 345 REs.

The signal strength and signal quality of detected neighbor cells are measured by the cell power and quality estimator 350, to determine whether any of the neighbor cells would be more suitable as a serving cell. The measurements are carried out on known signals, e.g., pilots/reference symbols (which may be common or dedicated) and/or synchronization signals, in the frequency domain.

The frame timings of serving cell and neighbor cells are tracked by the cell tracker unit 355. In certain implementations, the serving cell frame time tracking may be handled by the channel analyzer 315 instead.

Other aspects of the presently disclosed techniques and apparatus include methods of digitizing an analog signal, where at least some of such methods may correspond to the apparatuses described above. At a general level, one such method in a wireless device is for tuning the ADC sampling phase in fractions of a sample time, where the wireless device is operating on samples at a reduced sample rate compared to the minimum sample rate at which an arbitrary inter-symbol distance can be represented as an integer number of samples. In this method, the wireless device contains a clock providing clocking (i.e., providing a first clock signal) corresponding at least to the minimum frequency, and a clock divider providing a clocking (i.e., providing a second clock signal) corresponding to the reduced frequency, where the minimum and reduced frequencies are associated with the minimum and the reduced sample rates, respectively. This method comprises determining the desirable sample phase correction, and controlling a clock divider to select which multiple of a minimum rate clock cycle shall generate a reduced rate clock sample.

In some embodiments of this generalized method, the clock divider is implemented by a modulo counter, whereby the sampling phase can be shifted by adding to or removing from the counter a value that is proportional to the sampling phase shift to achieve a relative change in sampling phase. In other embodiments, the clock divider is implemented by a modulo counter, and the sampling phase is shifted by changing the value that a modulo counter output shall fulfill for generating a reduced rate clock sample, thus producing an absolute change in sample phase. The sampled symbols may be downlink OFDM symbol, in some cases. In some embodiments, there is an integer relation N between the minimum data rate and the reduced data rate. For instance, the minimum data rate may be 1.92 MS/s and the reduced data rate may be any of 240, 320 or 480 kS/s.

Figure 9:
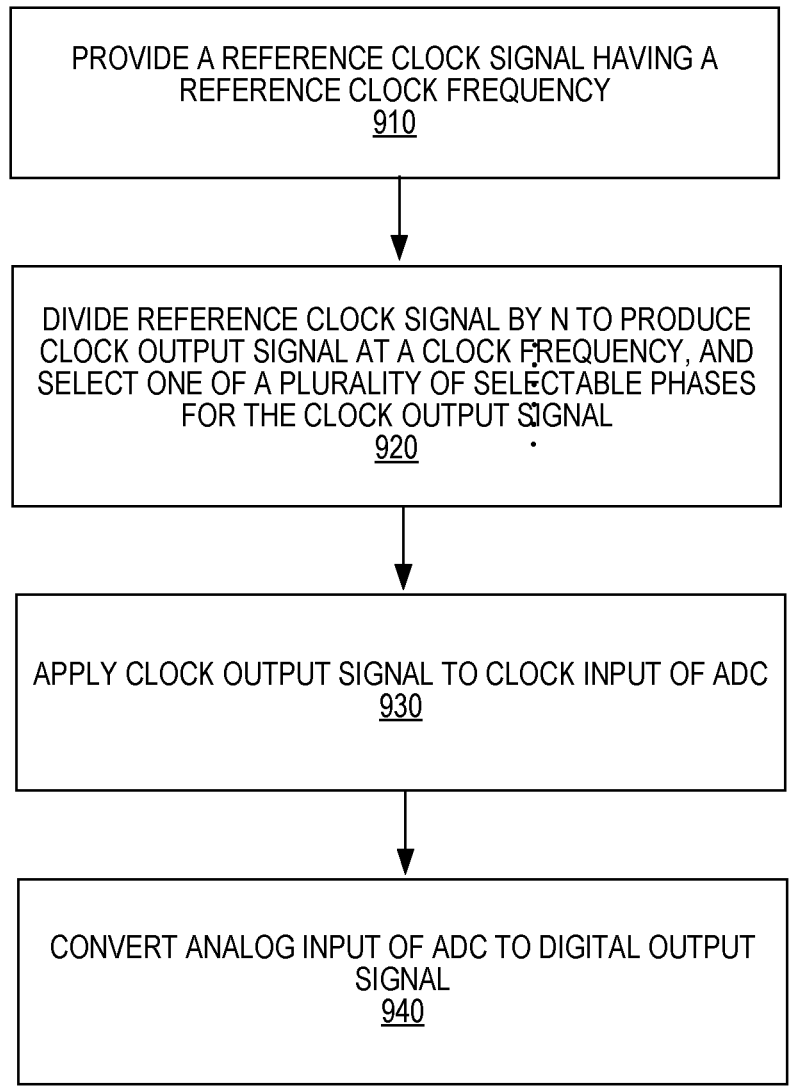
FIG. 9 is a process flow diagram illustrating an example method according to some embodiments of the presently disclosed techniques and apparatus.

One example method is illustrated in FIG. 9 and comprises, as shown at block 910, providing a reference clock signal having a reference clock frequency. As shown at block 920, the reference clock signal is divided by an integer N, thereby producing a clock output signal at a clock frequency. This producing of the clock output signal comprises selecting one of a plurality of selectable phases of the clock output signal, responsive to a phase selector signal. As shown at block 930, the clock output signal is applied to a clock input of an analog-to-digital (A-to-D) converter circuit having an analog input and a digital output. As shown at block 940, an analog signal provided to the analog input of the ADC circuit is converted to a digital output signal, at the digital output of the ADC circuit.

In some embodiments of the method shown in FIG. 9, producing the clock output signal comprises selecting from among N selectable phases of the clock output signal, responsive to the phase selector signal. In some embodiments, the reference clock frequency is 1.92 MHz, wherein N is eight. In some embodiments, the ADC circuit is a successive approximation ADC circuit.

While the inventive circuits and techniques described herein are described in the context of a system that uses OFDM, the actual circuits and techniques may be applied more generally. Thus, in some, but not necessarily all, embodiments of the method illustrated in FIG. 9, the analog signal is an OFDM signal. The OFDM signal consists of twelve subcarriers at a subcarrier spacing of 15 kHz, in some embodiments, and in some of these embodiments the clock signal is 240 kHz. In some embodiments, the OFDM signal consists of 14 OFDM symbols per 1-millisecond subframe, e.g., corresponding to a normal cyclic prefix mode. It will be appreciated that the technique illustrated in FIG. 9 may selectively be applied to signals having different symbol configurations at different times, e.g., in systems having a normal cyclic prefix mode and an extended cyclic prefix mode.

Non-Uniform Sampling

As discussed above, several embodiments of the presently disclosed techniques and apparatuses use a clock divider circuit that can be configured to clock the ADC, such as a SAR ADC, with any of N phases, where each phase corresponds to offsetting the sample timing by $1/N^{th}$ of the sample interval. The resulting sample clock, while having an adjustable phase, has a uniform sampling rate between such adjustments.

Another approach to address the problems discussed above, i.e., that applying a reduced sampling rate (e.g., 240 kS/s) to NB-IoT signal results in the cyclic prefixes having lengths that are not integer multiples of the sampling interval, is to use an ADC designed to apply a non-uniform sampling, when the cyclic prefix is sampled. Like the other approach discussed above, this approach allows NB LTE to operate without a need for up-sampling to ensure proper cyclic prefix removal. Thus, like the other approach, this approach facilitates lower chipset costs and chipset complexity, compared to a system that uses, for example a 1.92 MHz sampling rate for the 180 kHz effective NB-IoT bandwidth.

Figure 10:
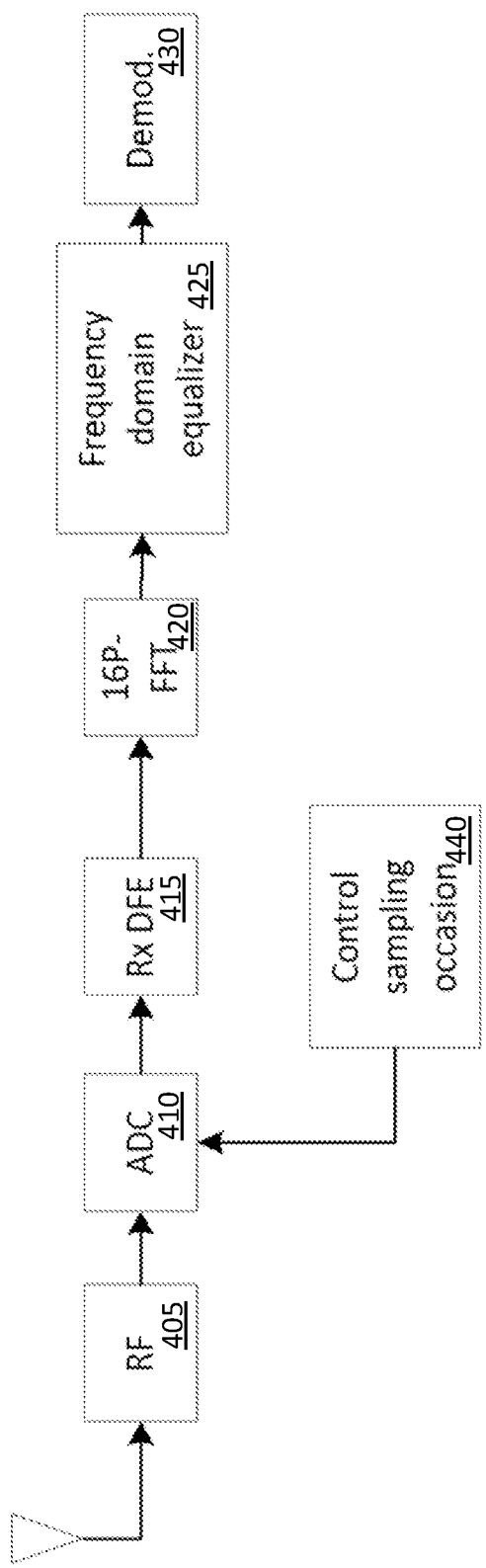
FIG. 10 shows an example receiver according to other embodiments of the presently disclosed techniques and apparatus.

FIG. 10 illustrates an example architecture for a downlink NB-IoT receiver. As discussed above, the useful bandwidth of NB LTE is 180 kHz, even when it is deployed within a wide LTE carrier. Therefore, the RF component 405 of an NB LTE receiver is only required to capture a radio signal sent on a 180 kHz channel. To capture the signal without any loss, it is sufficient to have a 180 kHz sampling rate in the baseband according to a Nyquist sampling theorem. Since there are 12 subcarriers, each having 15 kHz bandwidth, the FFT/IFFT size can be chosen to be 16, to facilitate FFT processing while minimizing the computational complexity as much as possible. Consequently, the baseband sampling rate is 15 kHz*16=240 kHz at the output of the RF component of the downlink receiver.

The functional blocks in FIG. 10 include an ADC 410 to convert from the analog domain into the digital domain. This can be, for example, a sigma-delta ADC, or a successive approximation ADC. In embodiments according to the presently disclosed techniques, this ADC 410 is enabled to change conversion occasion momentarily. The output frequency of the ADC 410 is typically 240 kHz for this particular NB-LTE application. However, the internal frequency of the ADC 410 can be higher and is dependent on implementation choice.

Another function block in FIG. 10 is a sampling occasion control 440. This is a receiver-side core block of some embodiments of the presently disclosed techniques, together with the ADC 410. The block controls the actual sampling occasion. It intercommunicates with the synchronization functionality of the system to acquire subframe synchronization. According to embodiments of the presently disclosed techniques, it counts samples, and when the cyclic prefix is sampled, it selectively adjusts the sampling phase to keep symbol and subframe timing and phase alignment. More particularly, expressed in the 240-kHz domain, 9/8 or 10/8 of ADC sampling period time is skipped, depending on which cyclic prefix in the subframe is being sampled, to remove the cyclic prefix altogether from the ADC conversion time, and to set the sampling position for the subsequent OFDM symbol without any noticeable signal discontinuity after output filtering. Referring to FIG. 2's illustration of the normal cyclic prefix case, it will be appreciated that 10/8 (1.25) of a sample interval corresponds to the length of the cyclic prefixes for the first and eighth symbols in the subframe, while 9/8 (1.125) of a sample interval corresponds to the length of the remaining cyclic prefixes.

Another block is the Digital Front End (DFE) 415 of the RF receiver. It may contain common known digital signal processing functionality such as DC suppression, IQ imbalance compensation and filtering, etc. The block showing 16-point FFT 420 does not have to remove the cyclic prefix, since that is already removed at AD conversion time. The downlink receiver also includes a frequency domain equalizer 425 and a demodulator 430.

Figure 11:
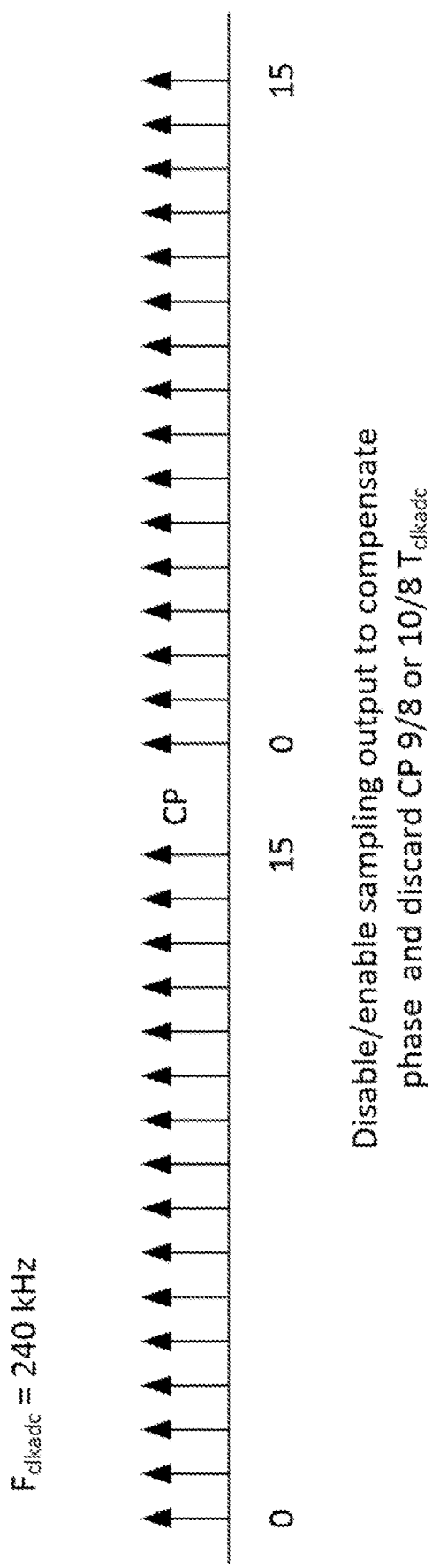
FIG. 11 illustrates the sampling outputs according to an exemplary embodiment of the presently disclosed techniques and apparatus.

FIG. 11 illustrates the resulting output from the ADC, when the control sampling occasion function adjusts the sampling phase as described above, i.e., to selectively disable and enable the sampling to discard the cyclic prefixes and to compensate for the sampling phase. As seen in the figure, the output from the ADC simply omits the cyclic prefixes, and adjusts the timing of the sampling after each cyclic prefix interval, so that each OFDM symbol is sampled at the same instances, relative to the end of the OFDM symbol.

Figure 12:
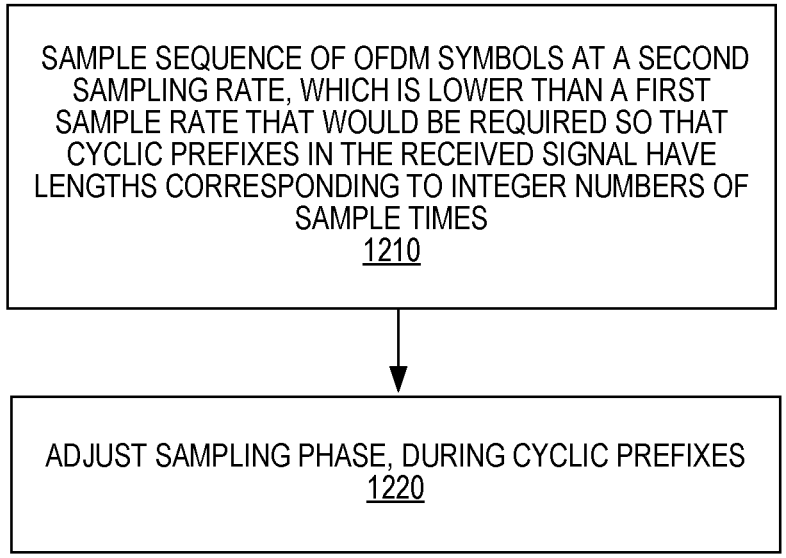
FIG. 12 is a process flow diagram illustrating another example method.

FIG. 12 illustrates an exemplary method, according to the techniques described above, in a receiver circuit, of processing a signal comprising a first sequence of an integer number $N_{sym}$ of OFDM symbols, which are transmitted within a frequency sub band of a second sequence of $N_{sym}$ OFDM symbols, where the first sequence of OFDM symbols and the second sequence of OFDM symbols are transmitted with the same timing. A first cyclic prefix of the second sequence of OFDM symbols has a first duration and a second cyclic prefix of the second sequence of OFDM symbols has a second duration. The second duration is shorter than the first duration, such that in order to sample both the first and the second cyclic prefix with an integer number of equidistant samples, a first sampling rate is required. The method comprises, as shown at block 1210, sampling the signal comprising the first sequence of OFDM symbols at a second sampling rate, lower than the first sampling rate. As shown at block 1220, the method further comprises adjusting a sampling phase during cyclic prefixes.

According to some embodiments of the illustrated method, a subcarrier spacing of the OFDM symbols of the first and second sequences of OFDM symbols are 15 kHz, the first duration is 160/30.72 µs and the second duration is 144/30.72 µs. In some embodiments, OFDM symbols of the first sequence of OFDM symbols have 12 subcarriers. The first sampling rate may be 1.92 MHz, for example. The second sampling rate may be 240 kHz, for example.

In some embodiments, the first cyclic prefix is an initial cyclic prefix of the second sequence of OFDM symbols, and all subsequent cyclic prefixes of the second sequence of OFDM symbols have the second duration. In some of these embodiments, the second sequence of OFDM symbols are transmitted in a third generation partnership program (3GPP) LTE system and corresponds to a slot.

In some embodiments, adjusting the sampling phase comprises setting an initial sampling instant during an OFDM symbol to occur a non-integer multiple of periods at the second sampling rate after a final sampling instant of a preceding OFDM symbol.

Figure 13:
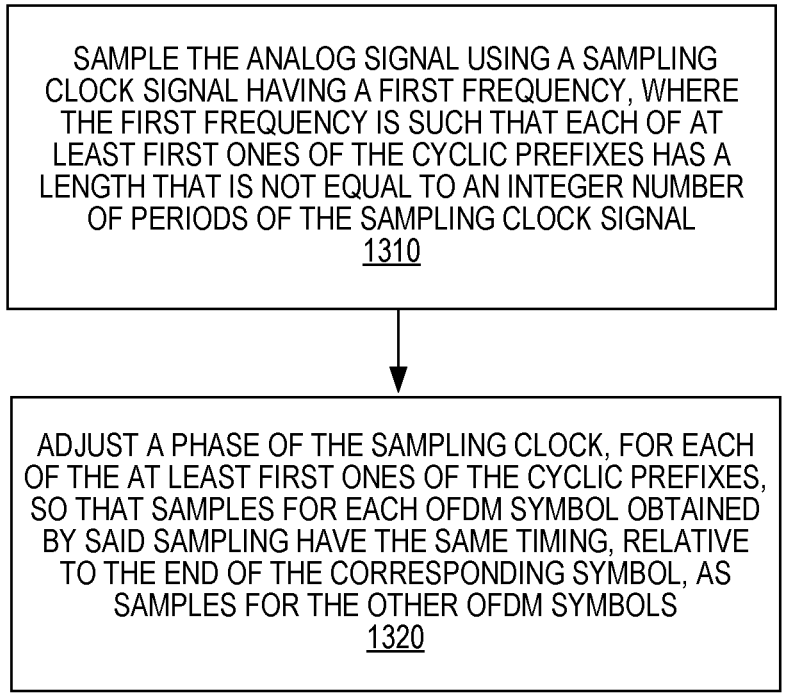
FIG. 13 is a process flow diagram illustrating yet another example method.

Some embodiments of the techniques described above may be described in terms of a method of sampling an analog signal comprising a sequence of OFDM symbols, each OFDM symbol having a preceding cyclic prefix. This method comprises sampling the analog signal using a sampling clock signal having a first frequency, where the first frequency is such that each of at least first ones of the cyclic prefixes has a length that is not equal to an integer number of periods of the sampling clock signal. This sampling step corresponds to that shown at block 1310 of FIG. 13. The method further comprises adjusting a phase of the sampling clock, for each of the at least first ones of the cyclic prefixes, so that samples for each OFDM symbol obtained by said sampling have the same timing, relative to the end of the corresponding symbol, as samples for the other OFDM symbols. This corresponds to block 1320 of FIG. 13.

In some embodiments, the sampling is performed at equidistant sample intervals during the sampling of each OFDM symbol. In some embodiments, the sampling comprises discarding or omitting samples corresponding to the cyclic prefixes.

In some embodiments, the cyclic prefixes include first cyclic prefixes having a first duration and second cyclic prefixes having a second duration, differing from the first duration. For example, some embodiments, the OFDM symbols have twelve subcarriers having a subcarrier spacing of 15 kHz, the first frequency is 240 kHz, and a duration of each of at least a first sequence of the OFDM symbols is 144/30.72 µs. In some of these embodiments, first ones of the cyclic prefixes each have a duration equal to 1.125 sample intervals for a 240-kHz sampling clock frequency, and wherein second ones of the cyclic prefixes each have a duration equal to 1.25 sample intervals of the 240-kHz sampling clock frequency.

The solutions presented herein may, of course, be carried out in other ways than those specifically set forth herein without departing from essential characteristics of the embodiments. The present embodiments are to be considered in all respects as illustrative and not restrictive, and all changes coming within the meaning and equivalency range of the appended claims are intended to be embraced therein.

What is claimed is:

1. A method in a receiver circuit of processing a received signal comprising a sequence of an integer number of OFDM symbols, wherein the method comprises:
    sampling the signal comprising the sequence of OFDM symbols at a sampling rate of 240 kHz;
    adjusting, during cyclic prefixes of the OFDM symbols, a sampling phase for sampling the signal.

2. The method of claim 1, wherein a first cyclic prefix for one or more of the sequence of OFDM symbols has a duration of 160/30.72 µs, a second cyclic prefix for one or more of the sequence of OFDM symbols has a second duration of 144/30.72 µs, and a subcarrier spacing of the OFDM symbols of the sequence of OFDM symbols is 15 kHz.

3. The method of claim 1, wherein a first cyclic prefix for one or more of the sequence of OFDM symbols has a first duration, a second cyclic prefix for one or more of the sequence of OFDM symbols has a second duration, and the second duration is shorter than the first duration, such that in order to sample both the first and the second cyclic prefix with an integer number of equidistant samples, a first sampling rate of 1.92 MHz would be required.

4. The method of claim 3, wherein the first cyclic prefix is an initial cyclic prefix of the sequence of OFDM symbols, and all subsequent cyclic prefixes of the sequence of OFDM symbols have the second duration.

5. The method of claim 4, wherein OFDM symbols of the sequence of OFDM symbols have 12 subcarriers.

6. The method of claim 5, wherein the sequence of OFDM symbols is transmitted in a Third-Generation Partnership Project (3GPP) Narrow-Band Internet-of-Things (NB-IoT) system and corresponds to a slot.

7. The method of claim 1, wherein adjusting the sampling phase comprises setting an initial sample instant during an OFDM symbol to occur a non-integer multiple of periods at the sampling rate after a final sample instant of a preceding OFDM symbol.

8. A receiver circuit for processing a received signal comprising a sequence of an integer number of OFDM symbols, wherein the receiver circuit comprises:
    an analog-to-digital converter configured to sample the signal comprising the sequence of OFDM symbols at a sampling rate of 240 kHz; and
    a control circuit configured to adjust, during cyclic prefixes of the OFDM symbols, a sampling phase of the digital-to-analog converter for sampling the signal.

9. The receiver circuit of claim 8, wherein a first cyclic prefix for one or more of the sequence of OFDM symbols has a duration of 160/30.72 µs, a second cyclic prefix for one or more of the sequence of OFDM symbols has a second duration of 144/30.72 µs, and a subcarrier spacing of the OFDM symbols of the sequence of OFDM symbols is 15 kHz.

10. The receiver circuit of claim 8, wherein a first cyclic prefix for one or more of the sequence of OFDM symbols has a first duration, a second cyclic prefix for one or more of the sequence of OFDM symbols has a second duration, and the second duration is shorter than the first duration, such that in order to sample both the first and the second cyclic prefix with an integer number of equidistant samples, a first sampling rate of 1.92 MHz would be required.

11. The receiver circuit of claim 10, wherein the first cyclic prefix is an initial cyclic prefix of the sequence of OFDM symbols, and all subsequent cyclic prefixes of the sequence of OFDM symbols have the second duration.

12. The receiver circuit of claim 11, wherein OFDM symbols of the sequence of OFDM symbols have 12 subcarriers.

13. The receiver circuit of claim 12, wherein the transmitter is configured to transmit the sequence of OFDM symbols in a Third-Generation Partnership Project (3GPP) Narrow-Band Internet-of-Things (NB-IoT) system, the sequence of OFDM symbols corresponding to a slot.

14. The receiver circuit of claim 8, wherein adjusting the sampling phase comprises setting an initial sample instant during an OFDM symbol to occur a non-integer multiple of periods at the sampling rate after a final sample instant of a preceding OFDM symbol.

15. An electronic device comprising the receiver circuit of claim 8.

16. The electronic device of claim 15, wherein the electronic device is a machine-type communication (MTC) device.

17. The electronic device of claim 15, wherein the electronic device is a network node for a cellular communication system.

* * * * *

UNITED STATES PATENT AND TRADEMARK OFFICE
CERTIFICATE OF CORRECTION

PATENT NO. : 11,239,961 B2  
APPLICATION NO. : 17/014214  
DATED : February 1, 2022  
INVENTOR(S) : Liu et al.

It is certified that error appears in the above-identified patent and that said Letters Patent is hereby corrected as shown below:

On the Title Page

In Item (71), under "Applicant", in Column 1, Line 1, delete "Telefonaktiebolaget LM Ericsson," and insert -- Telefonaktiebolaget LM Ericsson (publ), --, therefor.

Signed and Sealed this  
Fourth Day of July, 2023

Katherine Kelly Vidal  
*Director of the United States Patent and Trademark Office*